United States Patent
Leussler et al.

(10) Patent No.: US 7,633,294 B2
(45) Date of Patent: Dec. 15, 2009

(54) ELECTROMAGNETIC SHIELDING FOR HIGH FIELD MRI COILS

(75) Inventors: Christoph G. Leussler, Hamburg (DE); Kai-Michael Luedeke, Hamburg (DE); Michael A. Morich, Mentor, OH (US); Zhiyong Zhai, Cleveland, OH (US); Gordon D. DeMeester, Wickliffe, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 70 days.

(21) Appl. No.: 11/913,487

(22) PCT Filed: Apr. 19, 2006

(86) PCT No.: PCT/IB2006/051212

§ 371 (c)(1),
(2), (4) Date: Nov. 2, 2007

(87) PCT Pub. No.: WO2006/120588

PCT Pub. Date: Nov. 16, 2006

(65) Prior Publication Data

US 2008/0186026 A1     Aug. 7, 2008

Related U.S. Application Data

(60) Provisional application No. 60/678,441, filed on May 6, 2005.

(51) Int. Cl.
*G01V 3/00* (2006.01)
(52) U.S. Cl. .................................................. 324/318
(58) Field of Classification Search ......... 324/300–322; 600/410–435; 333/219–235; 343/787–792, 343/841–842, 872–873, 904–908
See application file for complete search history.

(56) References Cited

U.S. PATENT DOCUMENTS 4,439,733 A * 3/1984 Hinshaw et al. ............. 324/322

(Continued)

FOREIGN PATENT DOCUMENTS

EP    0290187 A2    4/1988

(Continued)

OTHER PUBLICATIONS

Adriany, "Transmit and Receive Arrays for Ultra High Field Parallel Imaging" http://www.mr.ethz.ch/parallelmri04/abstracts/pub/Adriany.pdf; Feb. 5, 2005.

(Continued)

*Primary Examiner*—Brij B. Shrivastav
*Assistant Examiner*—Dixomara Vargas (57) ABSTRACT

A radio frequency coil for magnetic resonance imaging includes an active coil member (70, 70₁, 170, 270) that defines an imaging volume. The active coil member has a first open end (74) with a first cross-sectional dimension (dactive). A shield coil member (72, 72₁, 72₂, 72₃, 72₄, 72₅, 172, 172₂, 272) substantially surrounds the active coil member. The shield coil member has a constricted open end (88) arranged proximate to the first open end of the active coil member with a constricted cross-sectional dimension (dconst) that is less than the cross-sectional dimension (dShield) of the shield coil member. In some embodiments, the radio frequency coil further includes an outer shield coil member (100) that is substantially larger than the shield coil member (72, 72₁, 72₂, 72₃, 72₄, 72₅, 172, 172₂, 272), and surrounds both the active coil member and the shield coil member.

22 Claims, 8 Drawing Sheets

U.S. PATENT DOCUMENTS

| | | | |
|---|---|---|---|
| 4,642,569 A | | 2/1987 | Hayes et al. |
| 4,939,465 A | | 7/1990 | Biehl et al. |
| 5,572,131 A | * | 11/1996 | Rzedzian .................... 324/318 |
| 5,581,186 A | * | 12/1996 | Keller ........................ 324/318 |
| 5,617,026 A | * | 4/1997 | Yoshino et al. ............. 324/318 |
| 6,020,740 A | | 2/2000 | Renz et al. |
| 6,396,271 B1 | | 5/2002 | Burl et al. |
| 6,498,947 B2 | | 12/2002 | Boskamp et al. |
| 6,501,275 B1 | * | 12/2002 | Westphal .................... 324/319 |
| 6,618,610 B2 | * | 9/2003 | Nabetani .................... 600/422 |
| 6,633,161 B1 | | 10/2003 | Vaughan |
| 6,642,717 B2 | * | 11/2003 | Dietz et al. ................ 324/318 |
| 6,791,328 B1 | | 9/2004 | Nabetani et al. |
| 6,882,153 B2 | * | 4/2005 | Vavrek et al. ............... 324/322 |
| 7,102,350 B2 | * | 9/2006 | Weyers et al. ............... 324/318 |
| 7,123,012 B2 | * | 10/2006 | Srinivasan .................. 324/318 |
| 7,145,339 B2 | * | 12/2006 | Saylor et al. ................ 324/318 |
| 7,166,999 B2 | * | 1/2007 | Duensing .................... 324/309 |
| 7,208,952 B2 | * | 4/2007 | Dietz ......................... 324/318 |
| 7,268,554 B2 | * | 9/2007 | Vaughan ..................... 324/322 |
| 7,279,899 B2 | * | 10/2007 | Michaeli et al. ............. 324/318 |
| 2004/0196043 A1 | | 10/2004 | Branch et al. |
| 2004/0245989 A1 | | 12/2004 | Holle |

FOREIGN PATENT DOCUMENTS

| | | |
|---|---|---|
| EP | 0825450 A2 | 2/1998 |
| JP | 02063436 A | 3/1990 |
| JP | 08252233 A | 10/1996 |
| WO | 0065365 A1 | 11/2000 |
| WO | 2004048990 A1 | 6/2004 |

OTHER PUBLICATIONS

Baertlein, et al. "Theoretical Model for an MRI Radio Frequency Resonator", IEEE Trans. on Biomedical Engineering, vol. 47, No. 4, Apr. 2000 pp. 535-546.

Barberi, et al., "A Transmit-Only/Receive-Only (TORO) RF System for High-Field MRI/MRS Applications", Magnetic Resonance in Medicine 43:284-289 (2000).

Hayes, et al., "An Efficient, Highly Homogeneous Radiofrequency Coil for Whole-Body NMR Imaging at 1.5 T", Journal of Magnetic Resonance 63, 622-628 (1985).

Tropp, "The Theory of the Bird-Cage Resonator", Journal of Magnetic Resonance 82, 51-62 (1989).

Vaughan, et al. "High Frequency Volume Coils for Clinical NMR Imaging and Spectroscopy" MRM 32:206-218 (1994).

* cited by examiner

ELECTROMAGNETIC SHIELDING FOR HIGH FIELD MRI COILS

CROSS REFERENCE TO RELATED APPLICATIONS

This application claims the benefit of U.S. provisional application Ser. No. 60/678,441 filed May 6, 2005, which is incorporated herein by reference.

The following relates to the magnetic resonance imaging arts. It finds particular application in high field magnetic resonance imaging (MRI), such as imaging at about 3 Tesla or higher, and will be described with particular reference thereto. However, it also finds application in magnetic resonance imaging performed at lower magnetic fields, in magnetic resonance spectroscopy and the like.

In magnetic resonance imaging, an imaging subject is placed in a temporally constant main magnetic field and subjected to radio frequency (RF) excitation pulses to generate nuclear magnetic resonances in the imaging subject. Magnetic field gradients are superimposed on the main magnetic field to spatially encode the magnetic resonances. The spatially encoded magnetic resonances are read out and reconstructed based on the spatial encoding to generate magnetic resonance images.

In magnetic resonance imaging, the signal to noise ratio (SNR) and other image characteristics generally improve as the main magnetic field strength increases. The Larmor, or nuclear magnetic resonance frequency is proportional to the magnetic field strength. For example, for proton imaging at 1.5 Tesla, the nuclear magnetic resonance frequency is about 64 MHz; at 3.0 Tesla, the nuclear magnetic resonance frequency is about 128 MHz; at 7.0 Tesla, the nuclear magnetic resonance frequency is about 298 MHz; and so forth.

At resonance frequencies up to about 128 MHz (3.0 Tesla), whole-body radio frequency coils are sometimes employed for radio frequency excitation and, optionally, for receiving magnetic resonance signals. An example of such a RF coil is a whole-body quadrature birdcage coil built into the housing of the magnetic resonance imaging scanner. Such a whole-body RF coil is conveniently permanently mounted, and provides a large field of view for whole-body imaging. Whole-body coils are less effective at magnetic fields of about 3 Tesla or higher, due to RF magnetic field spatial non-uniformities, coil loading, and other problematic factors that are enhanced at high resonance frequencies.

Local radio frequency coils can also be used for radio frequency excitation, for receiving magnetic resonance signals, or for both the transmit and receive phases. Compared with whole body coils, local RF coils are smaller and are more closely coupled with the region of the imaging subject that is being imaged. Accordingly, local RF coils have higher SNR for small regions than whole-body RF coils, especially at higher magnetic field strengths, such as at 7 Tesla. Examples of such local coils are head coils configured to fit over a human imaging subject's head for brain or other cranial imaging; arm or leg coils that fit over the corresponding limb; torso coils that fit over all or a portion of the patient's torso for cardiac imaging, lung imaging, or so forth; and generally planar or slightly curved surface coils that are placed near or in contact with the region of interest of the imaging subject.

At higher magnetic field strengths, particularly at about 3 Tesla or higher, even local radio frequency coils exhibit noticeably degraded performance due to RF transmission losses of electromagnetic fields. In the case of head coils, for example, there is strong electric field coupling with the patient's shoulders outside of the coil, leading to increased power requirements and specific absorption ratio (SAR) problems. At both open ends of the head coil, substantial radiative leakage is present, which lowers transmit coil efficiency and reduces SNR of the receive signals. In some head coils, the end distal from the neck and shoulders region is capped by an end-cap to reduce radiative losses at that end and minimize RF coupling to other structures outside of the coil. However, there are times when a coil open at both ends is clinically desirable. Existing radio frequency shields are effective at low magnetic field strengths, such as below about 3 Tesla, where the resonant frequency is low and the RF wavelength is long. When the RF wavelength is long compared to the RF shield diameter a RF coil and a RF shield of 65 cm diameter or so contains the imaging fields well. As the magnetic field and resonance frequency increases, for example at about 3 Tesla or higher, existing radio frequency shields become less effective at reducing electromagnetic coupling and radiative coil losses. For example, simulations of a conventional birdcage-type head coil including a cylindrical shield show radiative losses of about 20% at 7 Tesla.

The present invention contemplates improved apparatuses and methods that overcome the aforementioned limitations and others.

According to one aspect, a radio frequency coil for magnetic resonance imaging is disclosed. An active coil member defines an imaging volume. The active coil member has a first open end with a first cross-sectional dimension. A shield coil member substantially surrounds the active coil member. The shield coil member has a constricted open end arranged proximate to the first open end of the active coil member with a constricted cross-sectional dimension that is less than a cross-sectional dimension of the shield coil member.

According to another aspect, a radio frequency coil for magnetic resonance imaging is disclosed. An active coil member defines an imaging volume. The active coil member has a first open end with a first cross-sectional dimension. A shield coil member substantially surroundingly conforms with the active coil member. The shield coil member has an open end arranged proximate to the first open end of the active coil member. An outer shield coil member is substantially larger than the shield coil member, and surrounds both the active coil member and the shield coil member.

According to another aspect, a magnetic resonance imaging method is provided. A radio frequency magnetic field is generated of a frequency which excites magnetic resonance of a region of interest of a subject. The radio frequency field is in the region of interest as well as in other regions of the subject. Portions of the radio frequency field in other regions of the subject are shielded to enhance the radio frequency field in the region of interest.

One advantage resides in improved radio frequency coil efficiency.

Another advantage resides in reduced radiative losses for a radio frequency coil.

Another advantage resides in reduced SAR, and increased SNR for a radio frequency coil.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 6A shows the shielding coil member with the semi-annular detachable flange members installed; while, FIG. 6B shows the shielding coil member with the semi-annular detachable flange members removed.

Figure 1:
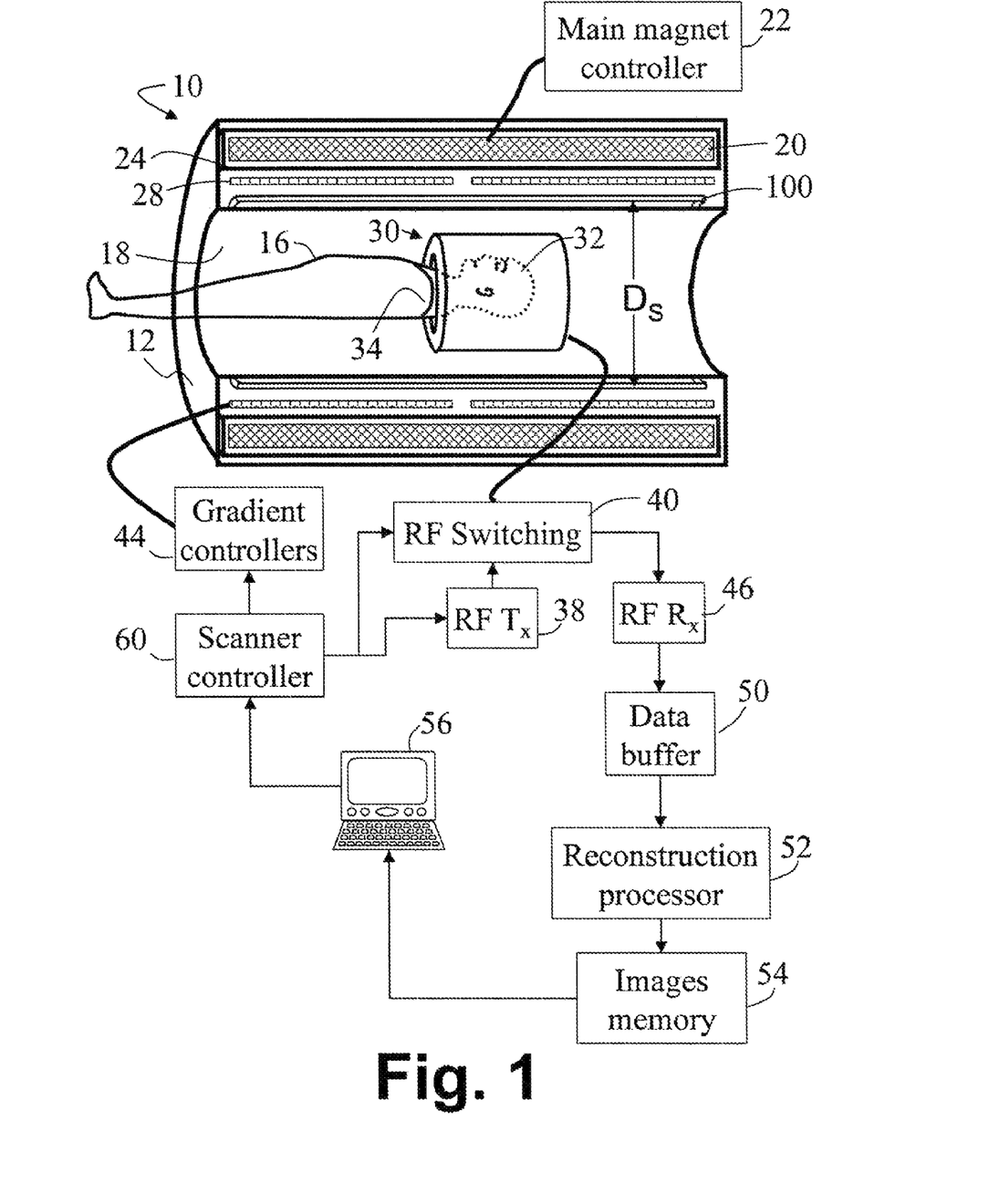
FIG. 1 diagrammatically shows an example magnetic resonance imaging system including a radio frequency head coil.

With reference to FIG. 1, a magnetic resonance imaging scanner 10 includes a scanner housing 12 in which a patient or other imaging subject 16 is at least partially disposed. A cosmetic bore liner 18 of the scanner housing 12 optionally lines a cylindrical bore or opening of the scanner housing 12 inside of which the imaging subject 16 is disposed. A main magnet 20 disposed in the scanner housing 12 is controlled by a main magnet controller 22 to generate a $B_0$ main magnetic field in the imaging subject 16. Typically, the main magnet 20 is a persistent superconducting magnet surrounded by cryoshrouding 24. The main magnet 20 generates a main magnetic field of typically about 3 Tesla or higher. In some embodiments, the main magnetic field is about 7 Tesla.

Magnetic field gradient coils 28 are arranged in or on the housing 12 to superimpose selected magnetic field gradients on the main magnetic field. Typically, the magnetic field gradient coils include coils for producing three orthogonal magnetic field gradients, such as x-gradients, y-gradients, and z-gradients. One or more radio frequency coils are disposed in the bore of the scanner 10 to inject $B_1$ radio frequency excitation pulses and to measure magnetic resonance signals. In the illustrated embodiment, a radio frequency head coil 30 surrounds a head 32 (shown in phantom in FIG. 1) of the imaging subject 16.

During magnetic resonance imaging data acquisition, a radio frequency power source 38 is coupled to the head coil 30 through radio frequency switching circuitry 40 to inject radio frequency excitation pulses into the imaging region defined by the head coil 30 so as to generate and receive magnetic resonance signals from the head 32 disposed inside the head coil 30. A magnetic field gradients controller 44 operates the magnetic field gradient coils 28 to spatially encode the magnetic resonances. For example, a one-dimensional magnetic field gradient applied during radio frequency excitation produces slice-selective excitation; magnetic field gradients applied between excitation and readout of magnetic resonances provide phase encoding; and magnetic field gradients applied during readout of magnetic resonances provide frequency encoding. The magnetic resonance imaging pulse sequences can be configured to produce Cartesian, radial, spiral, or other spatial encodings.

During the magnetic resonance readout phase, the switching circuitry 40 disconnects the radio frequency transmitter 38 from the head coil 30, and connects a radio frequency receiver 46 to the head coil 30 to acquire spatially encoded magnetic resonances from the head 32 disposed within the head coil 30. The acquired spatially encoded magnetic resonances are stored in a data buffer 50, and are reconstructed by a reconstruction processor 52 to produce reconstructed images of the head 32 or selected portions thereof that are stored in an images memory 54. The reconstruction processor 52 employs a reconstruction algorithm that suitably decodes the spatially encoded magnetic resonances. For example, if Cartesian encoding is employed, a two or three dimensional fast Fourier transform (FFT) reconstruction algorithm may be suitable.

The reconstructed images are suitably displayed on a user interface 56 or on another high resolution display device, are printed, communicated over the Internet or a local area network, stored on a non-volatile storage medium, or otherwise used. In the embodiment of FIG. 1, the user interface 56 also interfaces a radiologist or other operator with a scanner controller 60 to control the magnetic resonance imaging scanner 10. In other embodiments, a separate scanner control interface may be provided.

Figure 2A:
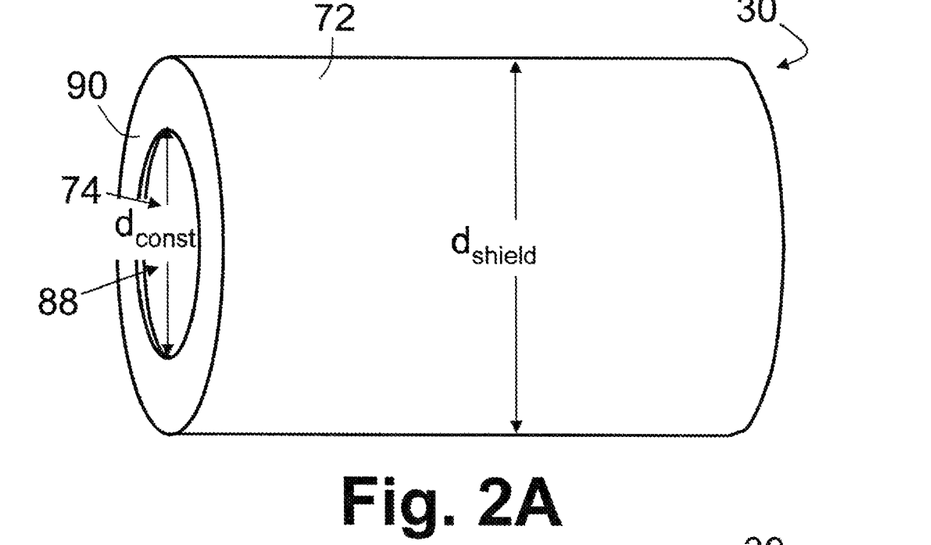
FIGS. 2A, 2B, and 2C shows perspective, perspective cutaway, and diagrammatic sectional views of the radio frequency head coil of FIG. 1.
Figure 2B:
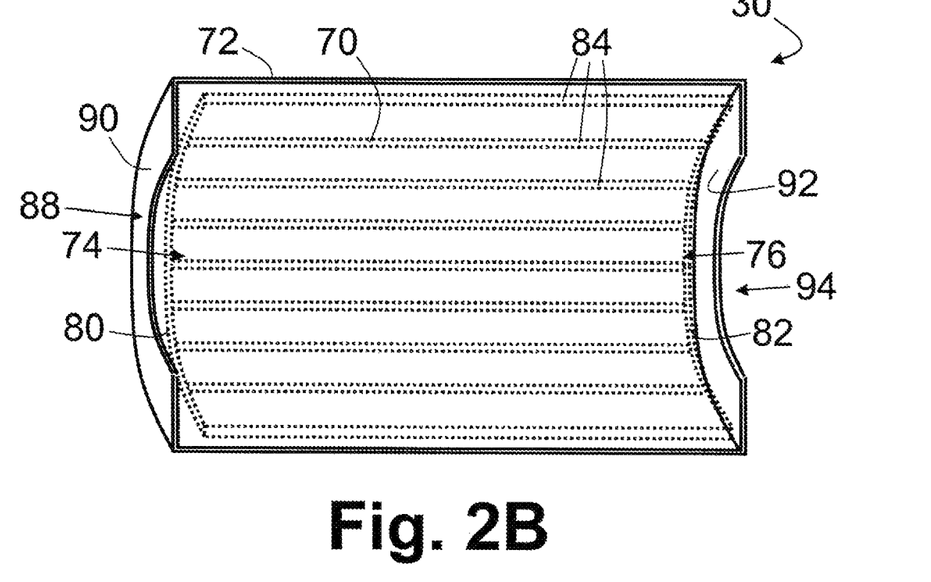
Figure 2C:
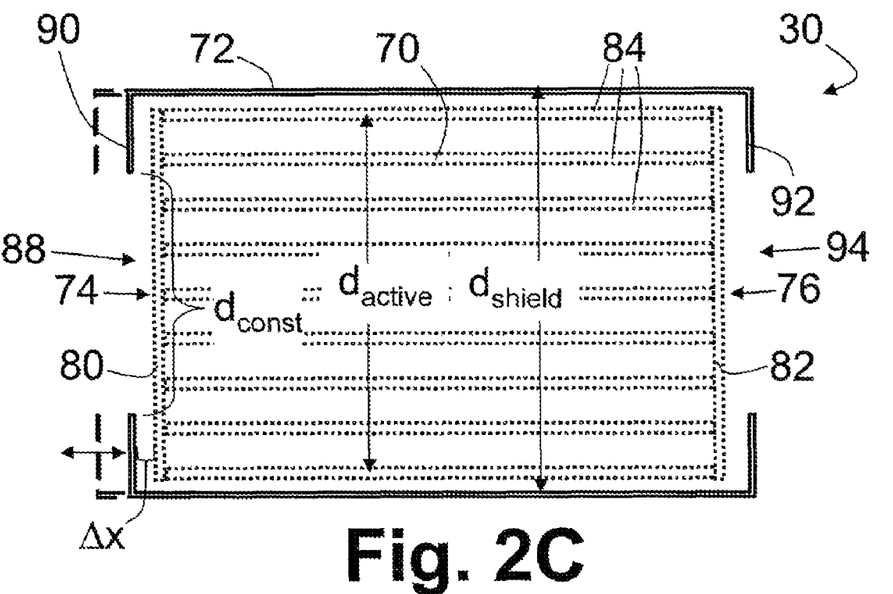

With continuing reference to FIG. 1 and with further reference to FIGS. 2A, 2B, and 2C, the head coil 30 is described in greater detail. The head coil includes an active coil member 70 substantially surrounded by a shield coil member 72. In the perspective view of FIG. 2A, only the surrounding shield coil member 72 is visible; FIG. 2B provides a cutaway view revealing slightly less than one-half of the active coil member 70. FIG. 2C provides a diagrammatic slice view for illustrating dimensional aspects of the radio frequency coil 30. The active coil member 70 is illustrated in FIGS. 2B and 2C using dotted lines to distinguish it more clearly from the surrounding shield coil member 72.

In the radio frequency coil 30, the active coil member 70 is a generally cylindrical birdcage coil having a substantially constant cross-sectional dimension corresponding to the cylinder diameter $d_{active}$. The active coil member 70 has a first open end 74 through which the neck of the imaging subject 16 passes, and an open second end 76 opposite the first open end. In a birdcage coil embodiment, the active coil member 70 includes a first end-ring 80 disposed adjacent the first open end 74, and a second end-ring 82 disposed adjacent the second open end 76. A plurality of rungs 84 arranged parallel to one another and transverse to the end-rings 80, 82 extend between the first and second end-rings 80, 82. The active coil member 70 could contain an array of capacitors, PIN diodes or other electronic circuitry control elements.

The surrounding shield coil member 72 is generally cylindrical in shape and arranged concentrically with the generally cylindrical active coil member 70. The surrounding shield coil member 72 has a cylindrical diameter $d_{shield}$ that is larger than the birdcage coil diameter $d_{active}$ so as to allow the shield coil member 72 to surround the active coil member 70. The shield member 72 may be made of segmented conducting materials bridged with capacitors or other electrical components, or may be a screen material without capacitors, or so forth.

The first end 74 of the active coil member 70 through which the neck passes is in close proximity to the shoulders 34 of the imaging subject 16. To reduce electromagnetic coupling with the shoulders 34, as well as to reduce radiative losses, the shield coil member 72 defines a constricted open end 88 arranged proximate to the first open end 74 of the active coil member 70. The constricted open end 88 has a constricted cross-sectional diameter $d_{const}$ produced by an annular flange 90 having an outer diameter corresponding to a diameter $d_{shield}$ of the generally cylindrical shield coil member 72 and an inner diameter defining the constriction diameter $d_{const}$.

A second annular flange 92 optionally defines a second constricted end 94 of the shield coil member 72. The second flange 92 reduces radiative losses at the second end 94 of the shield coil member 72. In the embodiment of FIGS. 2A, 2B, and 2C, the first and second flanges 90, 92 are identically sized and shaped, so that the ends of the shield coil member 72 and the radio frequency coil 30 are symmetric.

With particular reference to FIGS. 1 and 2C, reducing the constricted diameter $d_{const}$ (that is, making it more constricted) is expected to reduce radiative losses and electromagnetic coupling with the shoulders 34. However, the constricted diameter $d_{const}$ should be large enough to admit the head 32 into the shield coil member 72. Moreover, the flange 90 is separated from the first open end 74 of the active coil member 70 by a distance Δx. As this distance decreases, coupling between the active coil member 70 and the shoulders 34 is generally decreased. However, the decrease of Δx increases the coupling of the flange 90 with the end-rings 80, which can reduce coil sensitivity and SNR of head images. One suitable determination of distance Δx is the average distance between the center of the head 32 to the shoulders 34 minus half the length of the active coil member 70. There is an optimum value of the separation distance Δx that balances the advantage of reduced electromagnetic coupling with the shoulders 34 through the first open end 74 of the shield coil member 72 and the disadvantage of the decrease of coil sensitivity and image SNR. This optimum distance is suitably determined through electromagnetic simulation or by measuring electromagnetic leakage of the coil and comparing head image SNR for a series of trial values of the distance Δx.

Simulations for 7 Tesla (298 MHz) indicate that the flange 90 near the shoulders 34 reduces radiation loss by about one-half as compared with a similar coil with the flange 90 omitted. The flange 90 also reduces the SAR by about 8%, mainly through reduced applied power requirements due to reduced electromagnetic coupling with the shoulders 34. More of the applied power is applied to the region of interest and less is lost to adjoining regions or to radiation into the ambient. The cost of RF power increases with frequency/field strength so it is advantageous to reduce these losses.

The separation distance Δx also has some effect on the resonance frequency of the radio frequency coil 30. As a result, the separation distance Δx can also be used to tune the radio frequency coil 30 to the desired magnetic resonance frequency. Such tuning is suitably performed by trial-and-error for example, by making small adjustments in the separation distance Δx and measuring the resonance frequency of the radio frequency coil 30. In some embodiments, Δx at the shoulder side (that is, first open end 74) is adjusted to minimize radiative losses, while the equivalent separation at the opposite end of the coil (that is, second open end 76) is adjusted to tune the radio frequency coil 30.

With returning reference to FIG. 1, the radio frequency coil 30 still further optionally includes an outer shield coil member 100 surrounding both the active coil member 70 and the shield coil member 72. Unlike the shield coil member 72, which substantially surroundingly conforms with the active coil member 70, the outer shield coil member 100 is substantially larger than the active and shield coil members 70, 72. For example, in the embodiment of FIG. 1, the outer shield coil member 100 is substantially cylindrical and is substantially aligned with the bore of the magnetic resonance imaging scanner housing 12; whereas, the active and shield coil members 70, 72 are substantially smaller, and are disposed around the head 32 of the imaging subject 16. The head 32 is generally, but not necessarily, centered in the bore of the scanner housing 12. Electromagnetic simulations indicate that including the outer shield coil member 100 can reduce radiative losses for radio frequency coils operating at 7 Tesla by more than one-half. Generally, the outer shield coil member 100 is expected to be useful for scanners operating at greater than 3 Tesla, in combination with local RF shields.

To provide effective shielding against radiative losses, the outer shield coil member 100 should not itself act as a radiator. From waveguide theory, the lowest cutoff frequency (in MHz) of a hollow cylinder of infinite length is the mode $TE_{11}$ with $f_\lambda$ ($TE_{11}$)≈175.8/D (MHz), where D is the diameter of the waveguide in meters. As examples, for D=0.65 m, $f_\lambda$ ($TE_{11}$)≈270.5 MHz; for D=0.59 m, $f_\lambda$ ($TE_{11}$)≈298.0 MHz. Considering the resonance frequency of a 7 Tesla $^1$H coil is about 298 MHz, the cutoff frequency for an infinitely long cylindrical shield is slightly below or on the edge of the coil resonance frequency. These values are computed for an air core cylindrical waveguide of infinite length.

Figure 3:
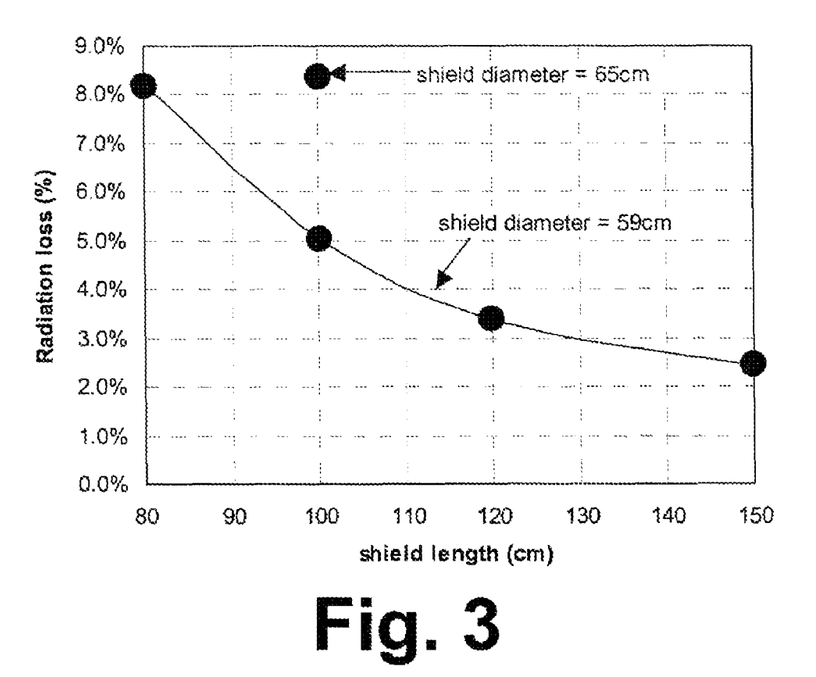
FIG. 3 plots radiative losses for outer shield coil members of different diameters and lengths.

FIG. 3 plots radiative loss versus length of the outer shield coil member 100 for one simulation at $D_S$=65 cm and for four simulations at $D_S$=59 cm for a locally shielded transmit birdcage head coil (without an end-constricting flanges 90, 92) loaded with a 5 mm-resolution realistic human body model at 7 Tesla. The radiation loss decreases with decreasing outer shield coil member diameter $D_S$. The radiation loss also decreases with increasing length of the outer shield coil member 100. The continuous line in FIG. 1 shows estimated radiative loss as a function of length of the outer shield coil member 100 for $D_S$=59 cm, based on the four simulations at $D_S$=59 cm. With the optional outer shield coil member 100 omitted entirely, the simulation indicated radiative loss of about 20%; hence, even for the larger diameter $D_S$=65 cm, the radiative loss is reduced by more than one-half by including a 1 meter long outer shield coil member 100.

Figure 4:
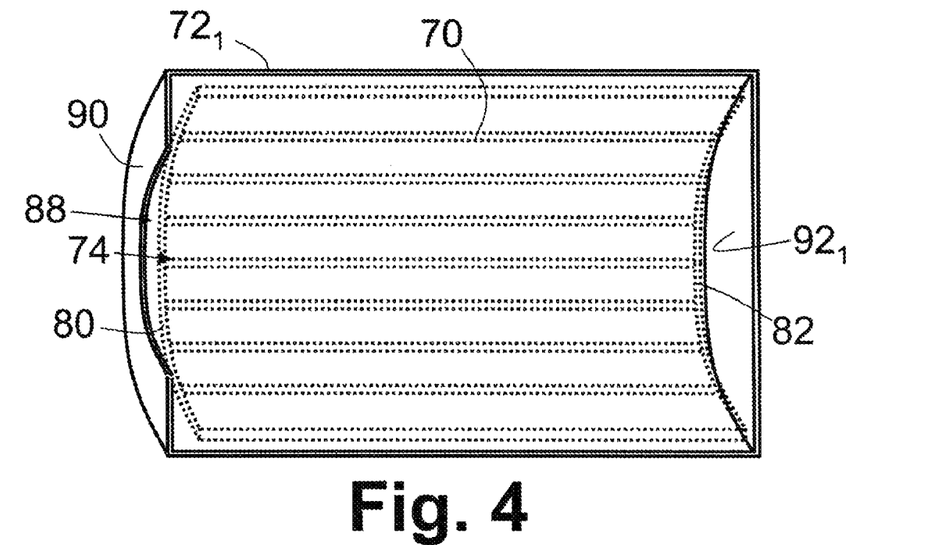
FIG. 4 shows a perspective cutaway view of a head coil having an end-cap.

With reference to FIG. 4, an alternative shield coil member 72₁ is similar to the shield coil member 72, except that the second flange 92 is replaced by an end-cap 92₁. In other words, in the shield coil member 72₁ the inner diameter of the second flange is reduced to zero.

Figure 5:
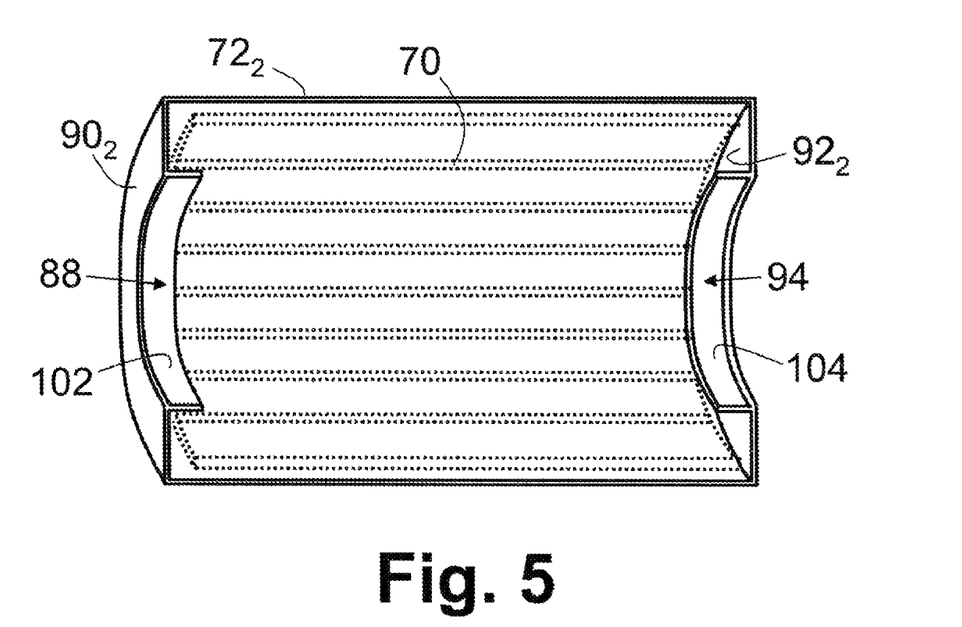
FIG. 5 shows a perspective cutaway view of a head coil with guard rings.

With reference to FIG. 5, another alternative shield coil member 72₂ is similar to the shield coil member 72, except that the first flange 92 is replaced by an alternative annular first flange 90₂ that includes an annular guard ring 102, and similarly the second flange 92 is replaced by an alternative annular second flange $92_2$ that includes an annular guard ring 104. Each of the guard rings 102, 104 extend into the shield coil member $72_2$, and in some embodiments extend into the active coil member 70. It will be appreciated that other modifications can be made to the flanges, such as canting or tilting the flanges toward or away from the main body of the shield coil member 72, providing continuously-curved or piecewise-curved flange surfaces rather than planar flange surfaces, and so forth.

Figure 6A:
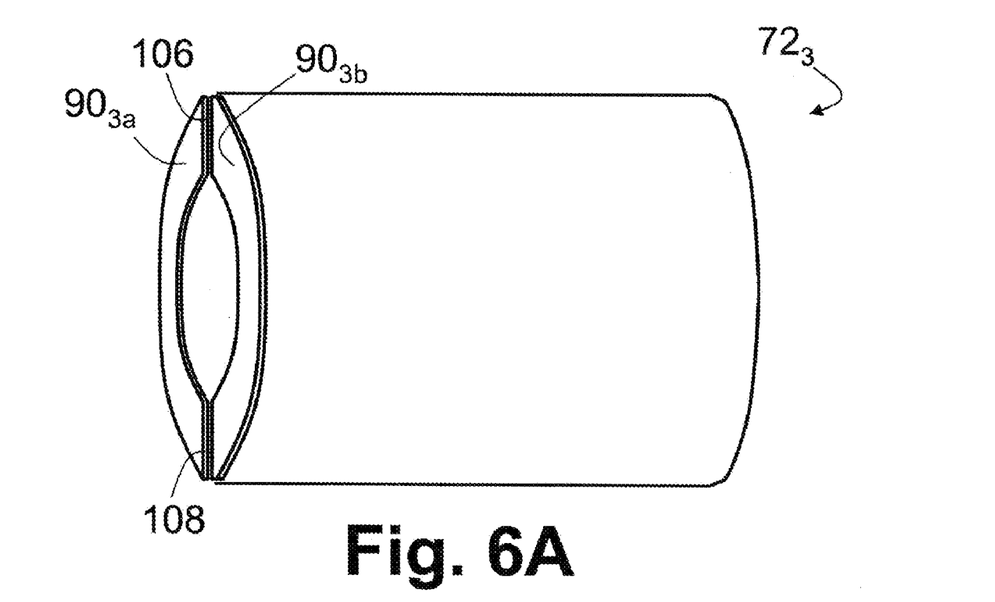
FIGS. 6A and 6B show perspective views of a shielding coil member with semi-annular flange members that are detachable for improved patient access.
Figure 6B:
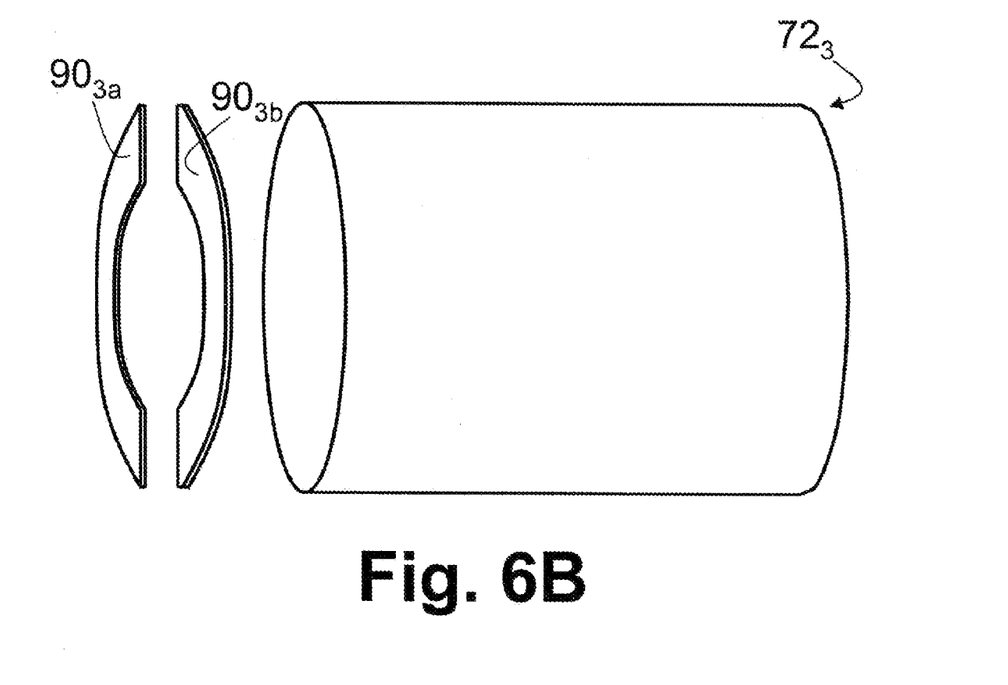

With reference to FIGS. 6A and 6B, in another alternative shield coil member $72_3$ the flange 90 is replaced by detachable semi-annular flange members $90_{3a}$, $90_{3b}$. FIG. 6A shows the attached configuration, in which the flange members $90_{3a}$, $90_{3b}$ are conductively and/or capacitively coupled with the main body of the shield coil member $72_3$. FIG. 6B shows the detached configuration—by removing the detachable flange members $90_{3a}$, $90_{3b}$, a larger opening is provided for inserting the head 32 of the imaging subject 16. After the head is inserted, the semi-annular flange members $90_{3a}$, $90_{3b}$ are installed onto the main body of the shield $72_3$ on either side of the neck. In this way, a smaller constricted diameter for the shield coil member $72_3$ can be achieved, providing correspondingly further improved efficiency and SAR. While the detachable flange members $90_{3a}$, $90_{3b}$ should match closely or overlap to provide a substantially unbroken annular flange in the installed configuration as shown in FIG. 6A, it is contemplated to allow small gaps 106, 108 at the junctions between the two flange members $90_{3a}$, $90_{3b}$ when installed. The gaps 106, 108 can be aligned away from the shoulders 34 to minimize their adverse effect in blocking electromagnetic coupling. The semi-annular detachable flange members can optionally include guard rings (not shown) similar to the guard ring 102 of FIG. 5. In other variations, three or more semi-annular detachable flange members are provided. For example, three detachable flange members each spanning about 120° can be used. Moreover, the second end of the shielding coil member $72_3$ can have a permanent flange, semi-annular detachable flange members, an end-cap, or can be fully open. Further, the opening in the flanges need not be circular. For example, the flanges can be wider proximate to the shoulders where electromagnetic coupling tends to be greatest, and narrower or apertured distal from the shoulders to reduce claustrophobic effects.

Figure 7:
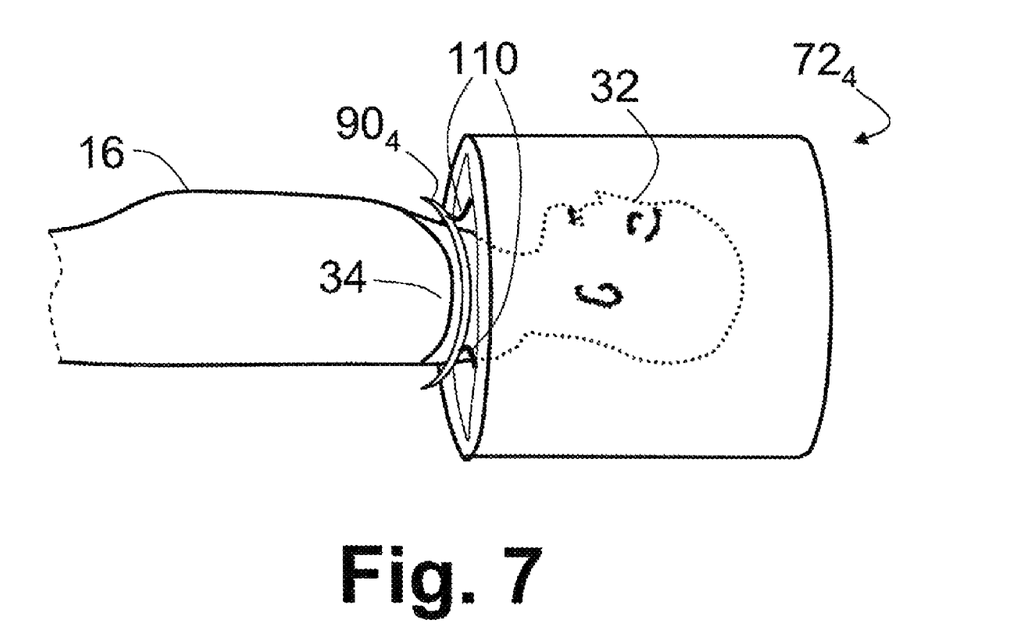
FIG. 7 shows a perspective view of a shielding coil member disposed over the head of the imaging subject, in which the shielding coil member has a conformably shaped flange that is shaped to substantially conform with a perimeter of the shoulders.

With reference to FIG. 7, in another alternative shield coil member $72_4$ the flange 90 is replaced by a conformably shaped flange $90_4$ that is shaped to substantially conform with a perimeter of the shoulders 34. The conformably shaped flange $90_4$ is conductively connected with the main body of the shield coil member $74_4$, for example directly or by conductive cables or wires 110. The conformably shaped flange $90_4$ is optionally detachable, so that a conformably shaped flange that best conforms with the shoulders of a particular patient can be selected, for example from a set of "small", "medium", "large", and "extra large" conformable flanges. Rather than attaching the conformably shaped flange $90_4$ to the main body of the shield coil member $72_4$, it could instead be mechanically attached and supported to the patient bed, and electrically coupled with the main body of the shield coil member $72_4$ by the cables 110. The second end of the shielding coil member $72_4$ can have a permanent flange, a removable flange, an end-cap, or can be fully open.

Figure 8:
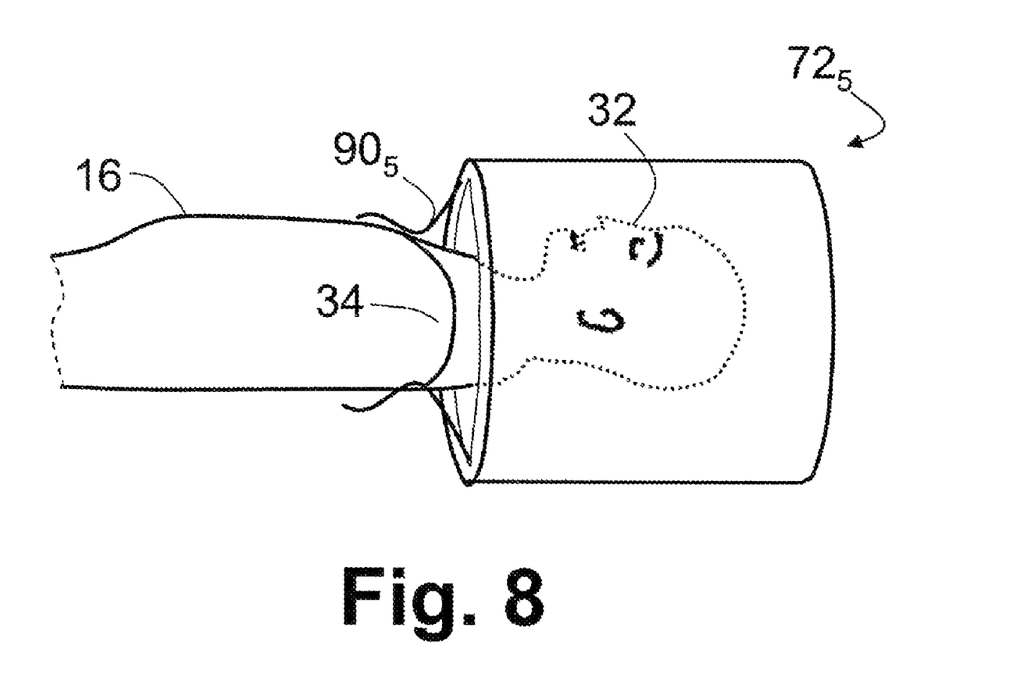
FIG. 8 shows a perspective view of a shielding coil member disposed over the head of the imaging subject, in which the shielding coil member has a flexible cloth flange that is disposed around a portion of the imaging subject outside of the coil.

With reference to FIG. 8, in another alternative shield coil member $72_5$ the flange 90 is replaced by a flexible cloth flange $90_5$ made of cloth interwoven with conductive fibers or wires, copper chain mail, metal mesh or screening, or the like. The cloth lays over the neck and shoulders of the imaging subject 16. The flexible flange $90_5$ may be coated with an insulating film or have insulating cloth outer layers to avoid conductive contact with the imaging subject 16. Optionally, the flexible cloth flange $90_5$ may be attached around the neck of the imaging subject 16 by clips, snaps, or so forth. The second end of the shielding coil member $72_5$ can have a permanent flange, a removable flange, an end-cap, or can be fully open.

Figure 9:
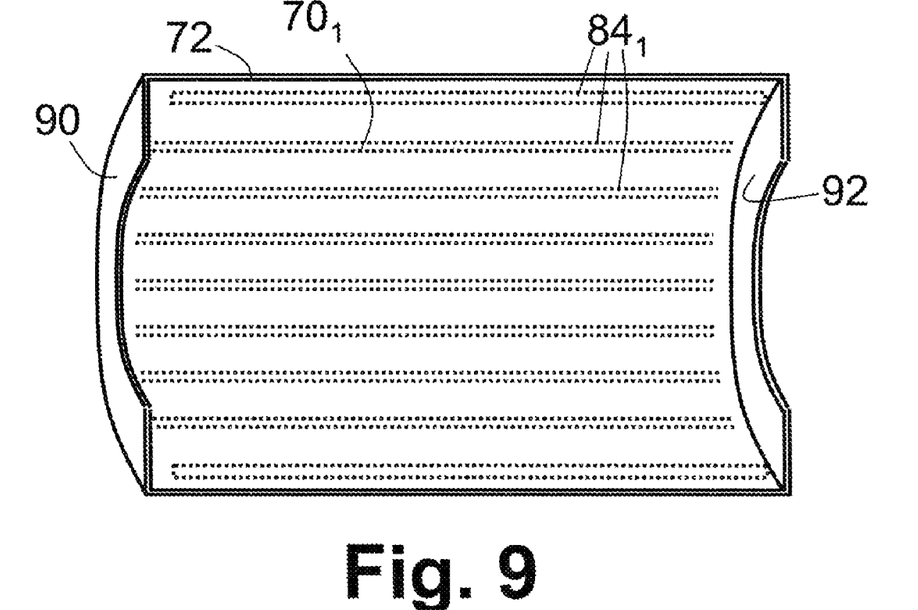
FIG. 9 shows a perspective cutaway view of a head coil similar to that of FIGS. 2A, 2B, and 2C, but with the birdcage-type active coil member replaced by a TEM-type active coil member.

With reference to FIG. 9, an alternative active coil member $70_1$ is a transverse-electromagnetic (TEM) coil rather than the birdcage-type active coil member 70. In the TEM coil $70_1$, the end-rings 80, 82 are omitted, and the rungs $84_1$ are similar to the rungs 84 of the birdcage coil 70, but the ends of the rungs $84_1$ are connected to the shield coil member 72 to provide closed current paths. It will be appreciated that other types of active coils can similarly be disposed inside the shield coil member 72.

The shield coil member 72, $72_1$, $72_2$, $72_3$, $72_4$, $72_5$ can be made of a conductive shell, a wire mesh or screen, a transparent, translucent, or opaque plastic shell with embedded conductive wires or fibers, or so forth. The active coil member 70, $70_1$ can be made of rigid conductors, printed circuitry, conductive strips, microstrips, metal rods or tubes, or the like disposed on or in a cylindrical former, or so forth. In some embodiments a common cylindrical former may support the active coil member 70, $70_1$ on an inner surface and the shield coil member 72, $72_1$, $72_2$, $72_3$, $72_4$, $72_5$ on an outside surface. Moreover, while cylindrically-shaped coil members are illustrated, the shield coil member, the active coil member, or both, can be elliptically-, conically-, or otherwise-shaped. Such shapes are intended to be encompassed by the term "generally cylindrical", which is not limited to right circular cylinders.

Similarly, the optional outer shield coil member 100 can be a conductive shell, a wire mesh or screen, a transparent, translucent, or opaque shell with embedded conductive wires or fibers, or so forth. In some embodiments, the outer shield coil member 100 is a metal film, metal film mesh, or so forth disposed on a dielectric former that also supports the magnetic field gradient coils 28. In some embodiments, the outer shield coil member 100 is a metal film, metal film mesh, or so forth disposed on an inner or outer surface of the cosmetic bore liner 18. In some embodiments, the outer shield coil member 100 is a metal film, metal film mesh, or so forth disposed on a stand-alone dielectric former. In some embodiments, the outer shield coil member 100 is a rigid, stand-alone metal film, metal film mesh, or so forth.

The active coil members 70, $70_1$ may include reactive elements such as capacitors or inductors for tuning of the active coil member to the magnetic resonance frequency. For example, birdcage coils typically include tuning capacitors in the end-rings, the rungs, or both. Capacitors in the end-rings can be a substantial source of electromagnetic leakage.

Figure 10:
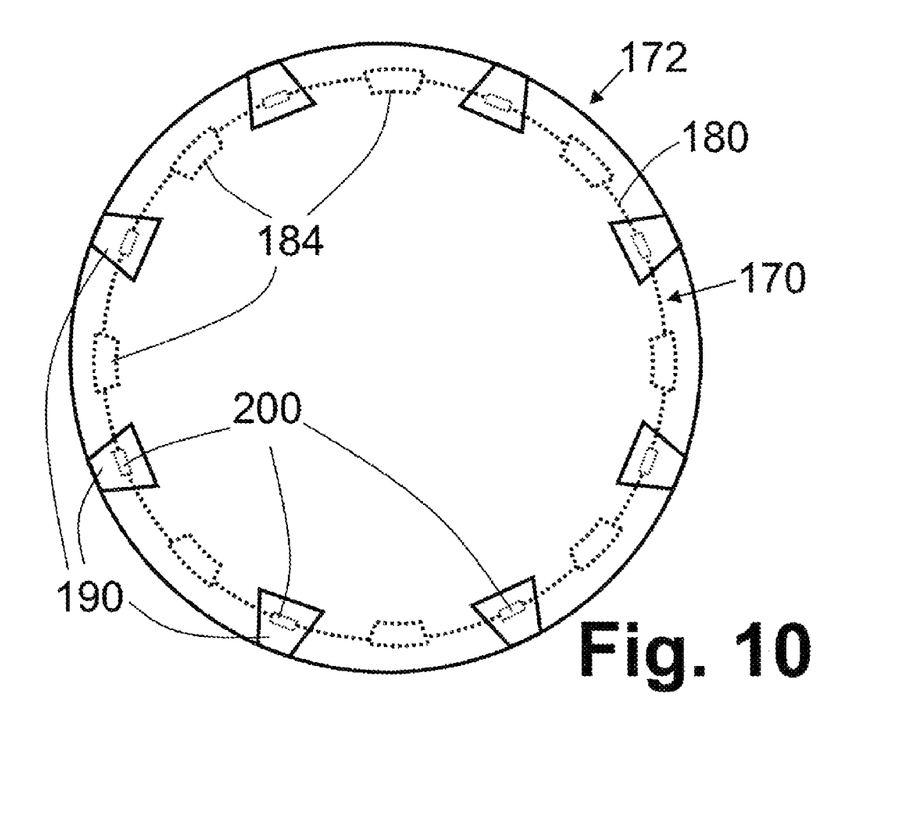
FIG. 10 diagrammatically shows an end view of a radio frequency coil including an active coil member with an end-ring having reactive elements, and a shielding coil member having a plurality of flange portions shielding the reactive elements.

With reference to FIG. 10, an active coil member 170 (drawn using dotted lines) is shielded by a shielding coil member 172 (drawn using solid lines). The illustrated active coil member 170 is a birdcage coil including an end-ring 180 that connects rungs 184. The shielding coil member 172 includes spaced-apart flange members 190 defining a constricted end of the shield coil member 172 having a constricted diameter equal to or less than the diameter of the active coil member 170. The end-ring 180 includes the reactive elements 200, such as lumped or distributed capacitors. The flange members 190 of the shielding coil member 172 are aligned with the lumped reactive elements 200 to reduce radiative loss and electromagnetic coupling via the reactive elements 200.

Figure 11:
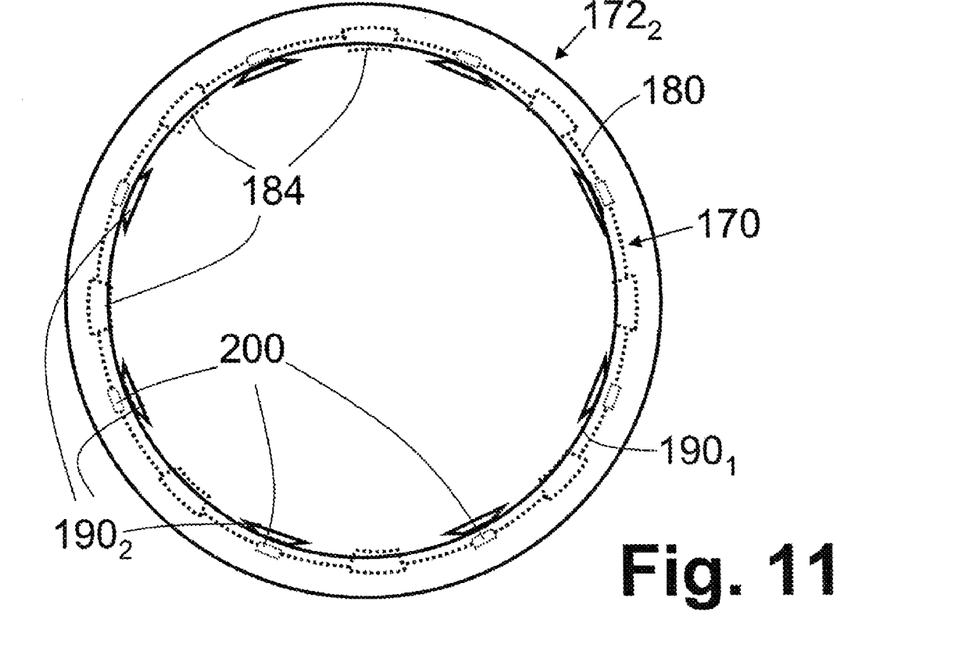
FIG. 11 diagrammatically shows an end view of a radio frequency coil including an active coil member with an end-ring having reactive elements, and a shielding coil member having a flange with guard ring portions shielding the reactive elements.

With reference to FIG. 11, the active coil member 170 (drawn using dotted lines) is shielded by a shielding coil member $172_2$ (drawn using solid lines). The shielding coil member $172_2$ includes a generally annular first flange $190_1$. Spaced-apart annular guard ring members $190_2$ extend into the active coil member 70. The spaced-apart annular guard ring members $190_2$ are aligned with the reactive elements 200 to reduce radiative loss and electromagnetic coupling via the reactive elements 200. The annular guard ring members $190_2$ are electrically connected to the flange $190_1$ or are optionally electrically floating without any connection to the flange $190_1$.

Figure 12:
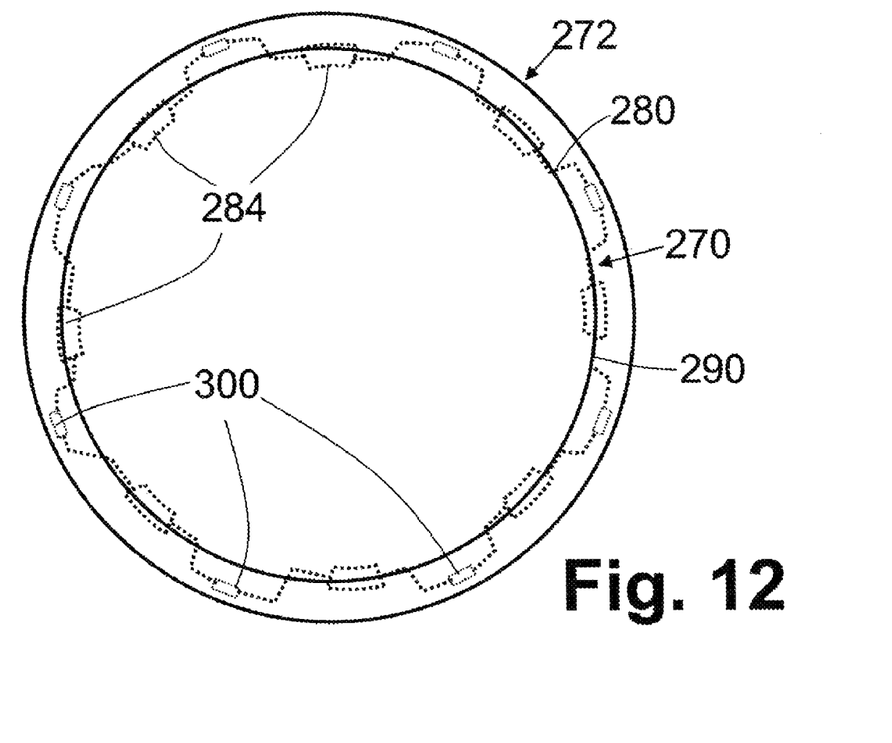
FIG. 12 diagrammatically shows an end view of a radio frequency coil including an active coil member with an end-ring having reactive elements at an outer diameter of the active coil member, and a shielding coil member having a flange shielding the reactive elements.

With reference to FIG. 12, an active coil member 270 (drawn using dotted lines) is shielded by a shielding coil member 272 (drawn using solid lines). The illustrated active coil member 270 is a birdcage coil including an end-ring 280 that connects rungs 284. The shielding coil member 272 includes an annular flange 290 defining a constricted end of the shield coil member 272. The end-ring 280 includes reactive elements 300, such as lumped or distributed capacitors. The end-ring 280 is configured with the reactive elements 300 at a larger radius than the rungs 284.

While head coils have been illustrated and described herein as examples, it will be appreciated that the illustrated and described radio frequency coils are readily adapted for use in imaging arms, legs, the torso, or other anatomical regions. In the case of torso, knee, or elbow imaging, for example, the radio frequency coils other than that of FIG. 4 are suitable (the endcap of the shielding coil member $72_1$ of FIG. 4 would interfere with placement of that particular example shielding coil member $72_1$ over a torso, knee, or elbow).

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A radio frequency coil for magnetic resonance imaging, the coil comprising:
   an active coil member defining an imaging volume, the active coil member having a first open end with a first cross sectional dimension; and
   a shield coil member substantially surrounding the active coil member, the shield coil member having a constricted open end arranged proximate to the first open end of the active coil member with a constricted cross sectional dimension less than a cross-sectional dimension of the shield coil member;
   wherein the active coil member and the shield coil member define concentric generally cylindrical shapes, the constricted open end of the shield coil member includes a flange having an inner diameter defining the constricted cross sectional dimension, and the flange includes one or more detachable flange members that are detachable from the generally cylindrical shield coil member to provide a larger access opening for the radio frequency coil.

2. The radio frequency coil as set forth in claim 1, wherein the flange includes a guard ring extending into the generally cylindrical shield coil member.

3. The radio frequency coil as set forth in claim 2, wherein the guard ring extends into the generally cylindrical active coil member and is displaced radially inward therefrom.

4. The radio frequency coil as set forth in claim 1, wherein the flange includes one or more flange members that substantially conform with a perimeter of an imaging object partially disposed inside the radio frequency coil and partially extending outside of the radio frequency coil.

5. The radio frequency coil as set forth in claim 4, wherein the one or more flange members that substantially conform with the perimeter of the imaging object include one or more conformably shaped flange members that substantially conform with the perimeter of the imaging object.

6. The radio frequency coil as set forth in claim 4, wherein the imaging object is a human being having a head disposed inside the radio frequency coil, the one or more flange members substantially conforming with shoulders of the human being.

7. A radio frequency coil for magnetic resonance imaging, the coil comprising:
   an active coil member defining an imaging volume, the active coil member having a first open end with a first cross sectional dimension;
   a shield coil member substantially surrounding the active coil member, the shield coil member having a constricted open end arranged proximate to the first open end of the active coil member with a constricted cross sectional dimension less than a cross-sectional dimension of the shield coil member, the constricted open end including a flange electrically connected to and extending radially inward from the constricted open end of the shield coil member, the flange being axially adjustable for tuning a resonance frequency of the active coil member.

8. The radio frequency coil as set forth in claim 7, wherein the active coil member has a second open end on an opposite side of the active coil member from the first open end, and the shield coil member has a second open end proximate to the second open end of the active coil member, the second open end being constricted to a cross sectional dimension less than the cross-sectional dimension of the shield coil member.

9. The radio frequency coil as set forth in claim 7, wherein the shield coil member has an end cap disposed at an end opposite the constricted open end of the shield coil member.

10. The radio frequency coil as set forth in claim 7, wherein the active coil member and the shield coil member define concentric generally cylindrical shapes.

11. The radio frequency coil as set forth in claim 7, wherein the constricted cross sectional dimension of the constricted open end of the shield coil member is less than or equal to the first cross sectional dimension of the first open end of the active coil member.

12. The radio frequency coil as set forth in claim 7, further including:
   an outer shield coil member substantially larger than the shield coil member and surrounding both the active coil member and the shield coil member.

13. A magnetic resonance imaging scanner comprising:
   a main magnet which generates a main magnetic field;
   magnetic field gradient coils which selectively superimpose magnetic field gradients on the main magnetic field; and
   a radio frequency coil as set forth in claim 7.

14. A radio frequency coil for magnetic resonance imaging, the coil comprising:
   an active coil member defining an imaging volume, the active coil member having a first open end with a first cross sectional dimension, the first open end of the active coil member including an end ring with electrically reactive elements; and
   a shield coil member substantially surrounding the active coil member, the shield coil member having a constricted open end arranged proximate to the first open end of the active coil member with a constricted cross-sectional dimension less than a cross-sectional dimension of the shield coil member, the constricted open end of the shield coil member including one or more flange portions arranged to shield the electrically reactive elements of the end ring of the active coil member, wherein the one or more flange portions are electrically floating relative to the remainder of the shield coil member.

15. The radio frequency coil as set forth in claim 14, wherein the one or more flange portions include a plurality of flange portions aligned with the electrically active elements to shield the electrically reactive elements.

16. The radio frequency coil as set forth in claim 14, wherein the end ring has a non-uniform cross sectional dimension with the electrically reactive elements disposed at outer regions of the end ring.

17. A radio frequency coil for magnetic resonance imaging, the coil comprising:
 an active coil member defining an imaging volume, the active coil member having a first open end with a first cross sectional dimension;
 a shield coil member substantially surroundingly conforming with the active coil member, the shield coil member having an open end arranged proximate to the first open end of the active coil member; and
 an outer shield coil member substantially larger than the shield coil member and surrounding both the active coil member and the shield coil member.

18. The radio frequency coil as set forth in claim 17, wherein the outer shield coil member is substantially cylindrical and is substantially aligned with a bore of an associated magnetic resonance imaging scanner.

19. The radio frequency coil as set forth in claim 18, wherein the associated magnetic resonance imaging scanner generates a $B_0$ magnetic field greater than 3 Tesla through the region of interest.

20. The radio frequency coil as set forth in claim 18, wherein the associated magnetic resonance imaging scanner generates a $B_0$ magnetic field greater than or about 4.7 Tesla through the region of interest.

21. The radio frequency coil as set forth in claim 17, wherein a diameter and length of the outer shield coil member are selected to substantially suppress radiative losses via the outer shield coil member at a magnetic resonance frequency.

22. A magnetic resonance imaging method comprising:
 generating a radio frequency magnetic field of a frequency which excites magnetic resonance of a region of interest of a subject, the radio frequency field being in the region of interest as well as in other regions of the subject; and
 shielding portions of the radio frequency field in other regions of the subject to enhance the radio frequency field in the region of interest wherein the radio frequency field is shielded by a shield coil member which extends around an axial end of an active coil member which generates the radio frequency field; and
 axially adjusting at least a portion of the shield coil member that extends around the axial end to adjust the resonance frequency of the active coil member.

* * * * *